United States Patent
Dillon et al.

(10) Patent No.: US 10,833,183 B2
(45) Date of Patent: Nov. 10, 2020

(54) INTERLAYER BALLISTIC TRANSPORT SEMICONDUCTOR DEVICES

(71) Applicant: GLOBALFOUNDRIES Inc., Grand Cayman (KY)

(72) Inventors: Joshua Dillon, Stowe, VT (US); Siva P. Adusumilli, South Burlington, VT (US); Jagar Singh, Clifton Park, NY (US); Anthony Stamper, Burlington, VT (US); Laura Schutz, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/177,877

(22) Filed: Nov. 1, 2018

(65) Prior Publication Data

US 2020/0144404 A1 May 7, 2020

(51) Int. Cl.
*H01L 29/76* (2006.01)
*H01L 29/66* (2006.01)
*H01L 29/872* (2006.01)

(52) U.S. Cl.
CPC .... *H01L 29/7606* (2013.01); *H01L 29/66969* (2013.01); *H01L 29/872* (2013.01)

(58) Field of Classification Search
CPC .......... H01L 29/7606; H01L 29/66969; H01L 29/872
See application file for complete search history.

(56) References Cited

U.S. PATENT DOCUMENTS

| | | | |
|---|---|---|---|
| 2013/0161587 A1* | 6/2013 | Xianyu | H01L 27/1266 257/29 |
| 2013/0330891 A1* | 12/2013 | Chang | H01L 21/84 438/241 |
| 2014/0183753 A1 | 7/2014 | Ellis-Monaghan et al. | |

OTHER PUBLICATIONS

Cheng et al., "Few-layer molybdenum disulfide transistors and circuits for high-speed flexible electronics," Nature Communications, Oct. 2014.
Di Bartlolomeo, "Graphene Schottky diodes: an experimental review of the recifying graphene/semiconductor heterojunction".

* cited by examiner

*Primary Examiner* — Timor Karimy
(74) *Attorney, Agent, or Firm* — Hoffman Warnick LLC (57) ABSTRACT

One device disclosed herein includes, among other things, first and second conductive features embedded in a first dielectric layer, a cap layer positioned above the first dielectric layer, a ballistic transport material contacting the first conductive member and positioned above a portion of the first dielectric layer, and first and second contacts contacting the first and second conductive features.

19 Claims, 6 Drawing Sheets

INTERLAYER BALLISTIC TRANSPORT SEMICONDUCTOR DEVICES

BACKGROUND

1. Field of the Disclosure

The disclosed subject matter relates generally to the fabrication of semiconductor devices and, more particularly, to forming interlayer ballistic transport semiconductor devices.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. Typically, active devices, such as transistors, diodes, resistors, capacitors, etc., are formed in a device layer of a semiconductor die. Interconnect layers are formed above the device layer to provide connections to and among the various devices. The uppermost interconnect layer presents the external interfaces for the die. Advanced semiconductor chip design is limited by circuit density. Increased density is generally achieved by decreasing the size of the individual devices. Reducing the device size requires more complicated manufacturing processes.

The present application is directed to various methods and devices that reduce the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming interlayer ballistic transport semiconductor devices. An illustrative device includes, among other things, first and second conductive features embedded in a first dielectric layer, a cap layer positioned above the first dielectric layer, a ballistic transport material contacting the first conductive member and positioned above a portion of the first dielectric layer, and first and second contacts contacting the first and second conductive features.

One illustrative method includes, among other things, forming first and second conductive features embedded in a first dielectric layer, forming a cap layer above the first dielectric layer, forming an opening in the cap layer exposing at least a portion of the first conductive feature and a portion of the first dielectric layer positioned between the first and second conductive features, forming a ballistic transport material in the opening contacting the first conductive member and positioned above the exposed portion of the first dielectric layer, and forming first and second contacts contacting the first and second conductive features.

Another illustrative method includes, among other things, forming first and second conductive features embedded in a first dielectric layer, forming a cap layer above the first dielectric layer, forming an opening in the cap layer exposing portions of the first and second conductive features and a portion of the first dielectric layer positioned between the first and second conductive features, forming a ballistic conductor material in the opening connecting the first and second conductive features, forming a gate structure above the ballistic conductor material, forming first and second contacts contacting the first and second conductive features, and forming a third contact contacting the gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

Figure 1A:
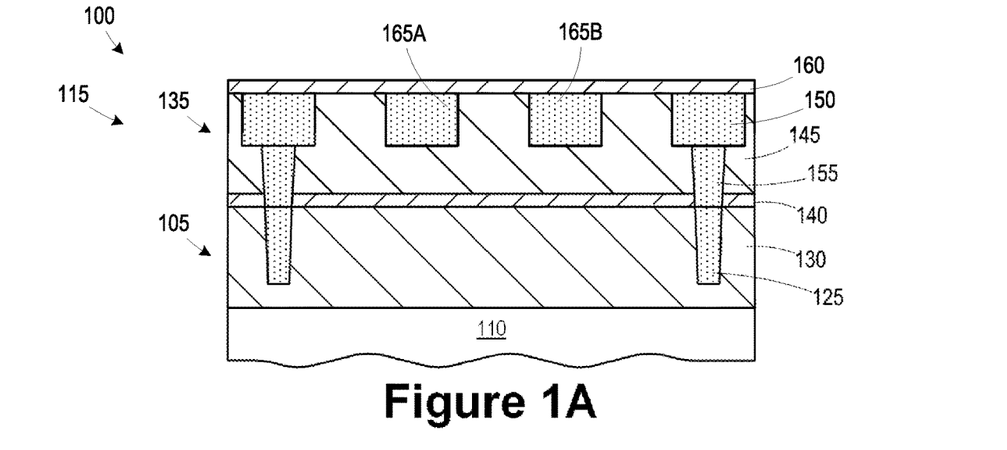
FIGS. 1A-1H are cross-sectional diagrams depicting illustrative techniques for forming a ballistic transport transistor device.

FIGS. 1A-1H are cross-sectional diagrams depicting illustrative techniques for forming a ballistic transport transistor device in a semiconductor product 100. FIG. 1A illustrates the product 100 including a device layer 105 formed in and above a substrate 110 in which semiconductor-based circuit elements may be provided. For convenience, any such circuit elements are not shown in FIG. 1A. The substrate 110 may also include any appropriate microstructure features, such as micromechanical components, optoelectronic components and the like, wherein at least some of these components may require an interconnect structure formed in a metallization system 115. In highly complex integrated circuits, a very large number of electrical connections may be required and, thus, a plurality of metallization layers may typically be formed in the metallization system 115.

The device layer 105 includes contacts 125 (e.g., tungsten) formed in a dielectric layer 130 for contacting underlying devices, such as transistors (not shown). A first metallization layer 135 of the metallization system 115, including a cap layer 140 (e.g., SiN, SiCN, etc.) and a dielectric layer 145, is formed above the device layer 105. The first metallization layer 135 is formed using a conventional dual damascene process to define conductive lines 150 (e.g., copper) to provide intra-layer signal paths and vias 155 (e.g., copper) to provide interlayer signal paths. A cap layer 160 (e.g., SiN, SiCN, etc.) is formed above the dielectric layer 145. The dielectric layers 130, 145 may be the same or different materials. In the illustrated embodiment, the dielectric layer 145 may be a low-k dielectric material having a dielectric constant of approximately 3.0 or lower or an ultra-low-k (ULK) material having a dielectric constant of approximately 2.5 or lower.

Figure 1B:
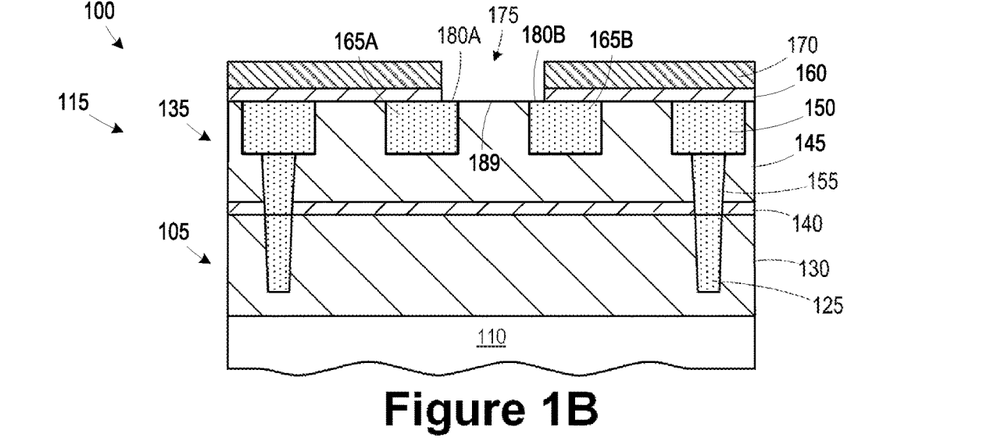

In general, the layout density of the metallization layer 135 is significantly less than the layout density of the device layer 105. Unused real estate in the metallization layer 135 may be employed to form ballistic transport semiconductor devices as described in greater detail herein. As seen in FIG. 1A, first and second conductive features 165A, 165B are formed in the dielectric layer along with the conductive features 150, 155 employed to interface with the device layer 105. The conductive features 165A, 165B may be lines extending into and/or out of the page in FIG. 1A, FIG. 1B illustrates the product 100 after several processes were performed. A mask layer 170 (e.g., photoresist, patterned hard mask, or a photolithography stack of layers) was formed above the cap layer 160. The mask layer 170 was patterned to define an opening 175. The cap layer 160 was etched through the opening to expose edge portions 180A, 180B of the conductive features 165A, 165B and a portion 189 of the dielectric layer 160 positioned between the conductive features 165A, 165B.

Figure 1C:
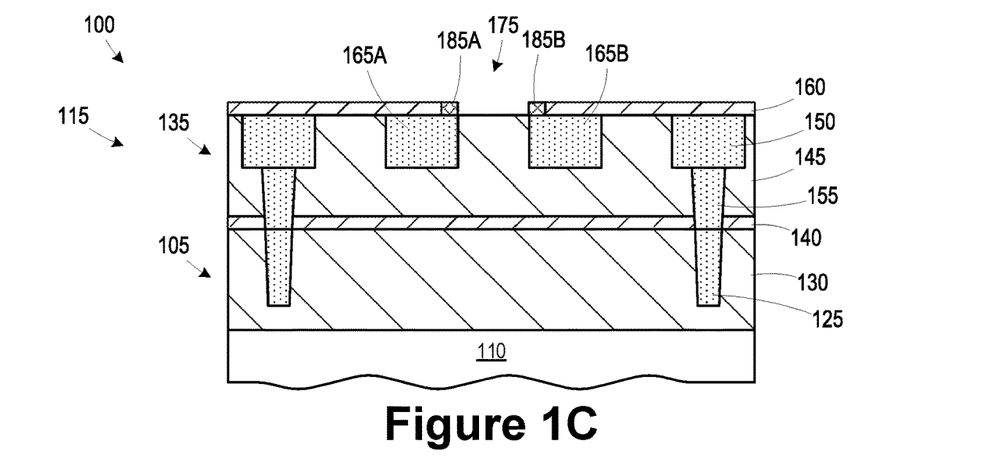

FIG. 1C illustrates the product 100 after a deposition process (e.g., electroless plating) was performed to form barrier layers 185A, 185B (e.g., cobalt-tungsten phosphide or some other self-aligned barrier material) over the exposed edge portions 180A, 180B. The mask layer 170 may be removed prior to forming the barrier layers 185A, 185B.

Figure 1D:
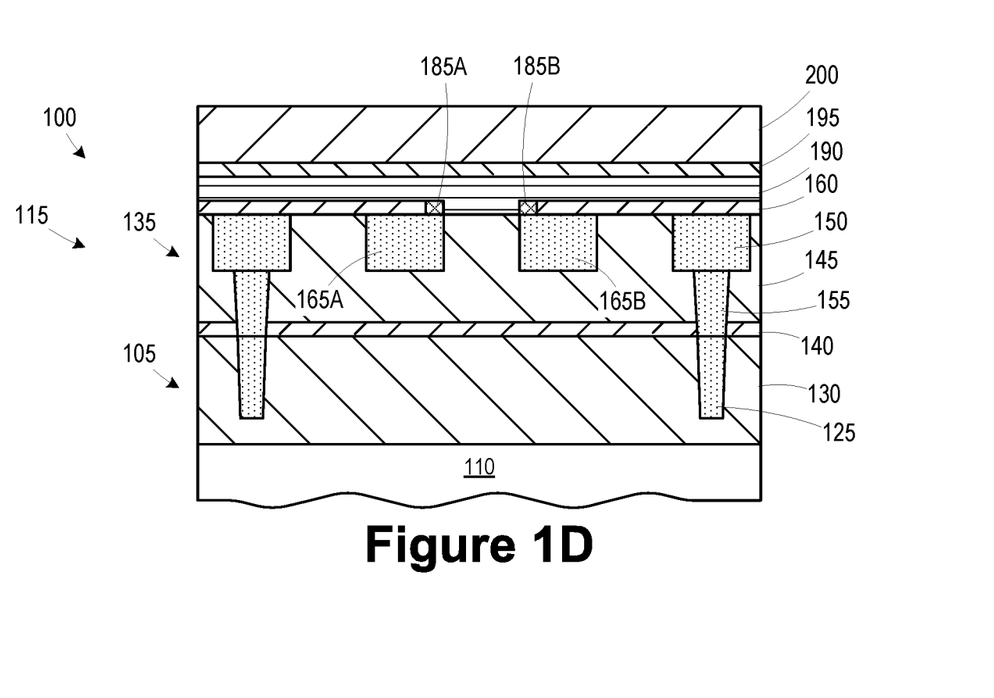

FIG. 1D illustrates the product 100 after several deposition processes were performed to form a ballistic transport material layer 190, a gate insulation layer 195 (e.g., silicon dioxide, hafnium oxide, etc.), and a gate electrode layer 200 (e.g., polysilicon, metal, etc.). The ballistic transport material layer 190 is formed from a material that exhibits ballistic transport, where the transport of electrons occurs in a medium having negligible electrical resistivity caused by scattering. In contrast, a conventional Ohmic conductor material has a resistivity value that is in large part defined by the degree of scattering within the material. In some embodiments, the ballistic transport material layer 190 may include a plurality of layers of ballistic transport material formed in a stack. In other embodiments, a stack may be formed by alternating layers of ballistic transport material and cladding material.

Exemplary ballistic transport materials include molybdenum disulfide, graphene, carbon nanotubes, silicon nanowires, samarium hexaboride, stanene, silicene, boronene and topolocial insulators, such as mercury telluride, cadmium telluride, bismuth antimonide, pure antimony, bismuth selenide, bismuth telluride, and antimony telluride. In general, ballistic transport materials provide low-capacitance signal paths with very thin material layers. In general, ballistic transport materials may be formed in very thin sheets, sometime as thin as the thickness of a single atom.

Figure 1E:
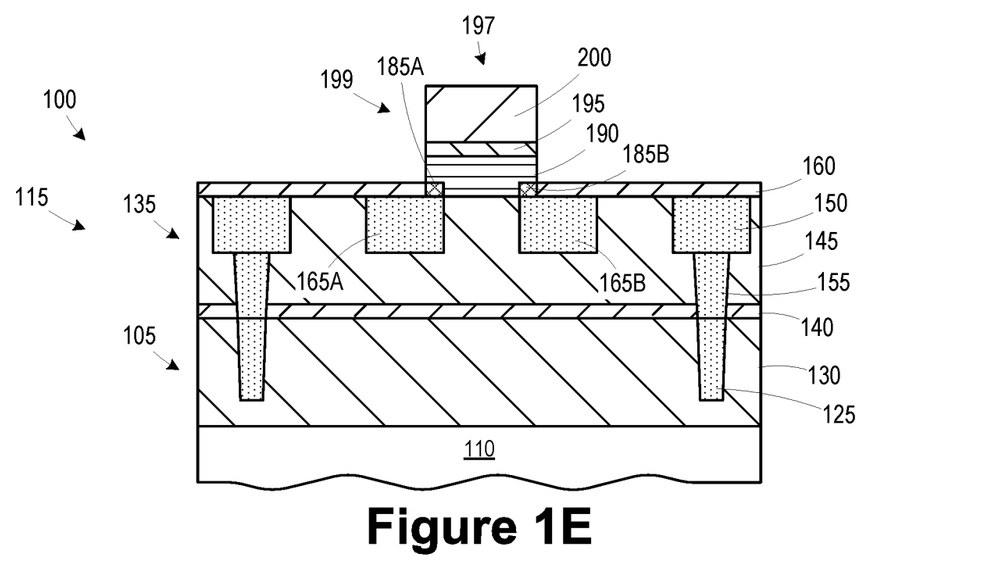

FIG. 1E illustrates the product 100 after a patterning process including multiple steps has been performed to pattern the ballistic transport layer 190, the gate insulation layer 195, and the gate electrode 200. In one embodiment, the gate insulation layer 195 and the gate electrode 200 may have the same width as the ballistic transport layer 190. The gate insulation layer 195 and the gate electrode 200 define a gate structure 197. The ballistic transport layer 190 and the gate structure 197 define a ballistic transport transistor 199, where the ballistic transport layer 190 conducts responsive to a gate voltage being applied at the gate structure 197.

Figure 1F:
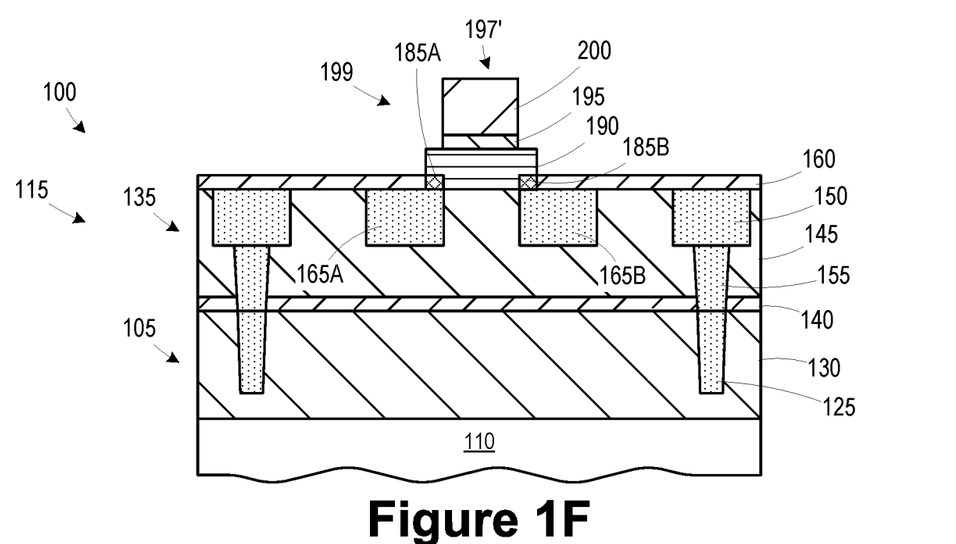

In another embodiment illustrated in FIG. 1F, the gate insulation layer 195 and the gate electrode 200 may be patterned using a first mask, and the ballistic transport layer 190 may be patterned using a second mask to define a gate structure 197' with a different width.

Figure 1G:
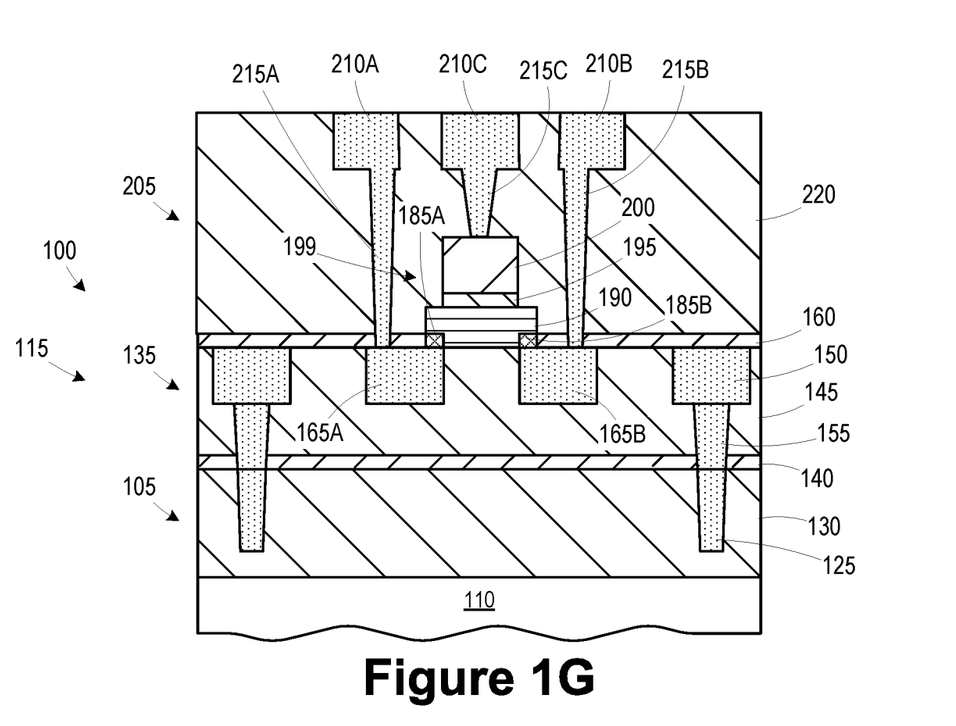

FIG. 1G illustrates the product 100 of FIG. 1F after a plurality of processes were performed to define a second metallization layer 205 of the metallization system 115 above the first metallization layer 135. The second metallization layer 205 may be formed using a conventional dual damascene process flow to define conductive lines 210A, 210B, 210C and vias 215A, 215B, 215C in a dielectric layer 220. The lines 210A, 210B and vias 195A, 195B contact the conductive features 165A, 165B, respectively, and the line 210C and via 215C contact the gate electrode 200. The terms "first" and "second" with respect to the metallization layers are used to distinguish between the layers rather than to imply a particular spatial relationship. The device layer 105 includes interconnect features, and it may also be considered a metallization layer within the metallization system 115.

Figure 1H:
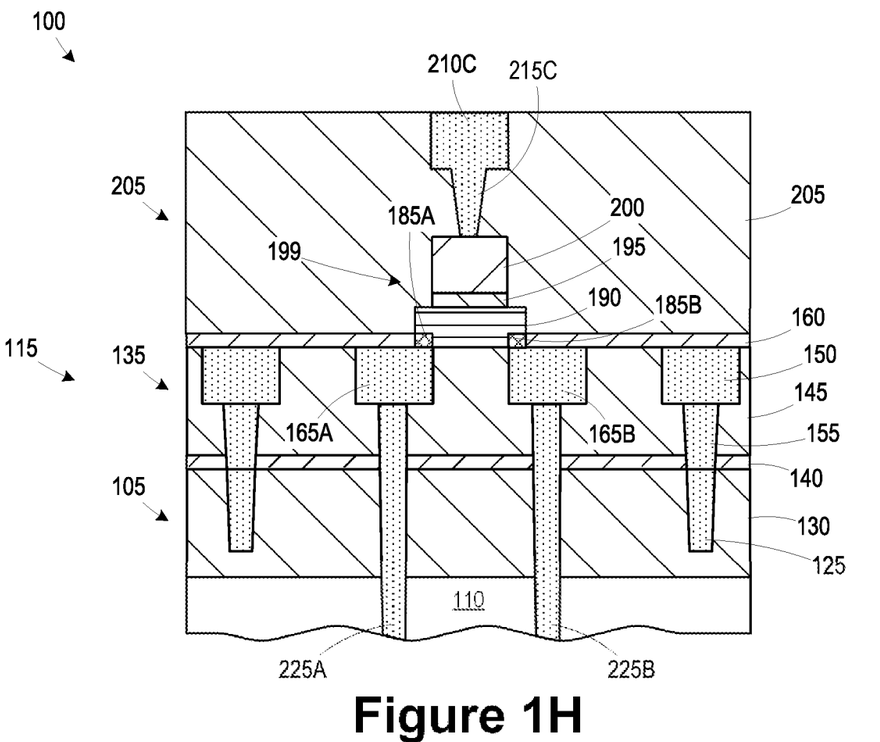

FIG. 1H illustrates an alternative embodiment of the product 100, wherein the conductive elements 165A, 165B may be contacted from a back side of the substrate 110 using through-silicon vias 225A, 225B.

Figure 2A:
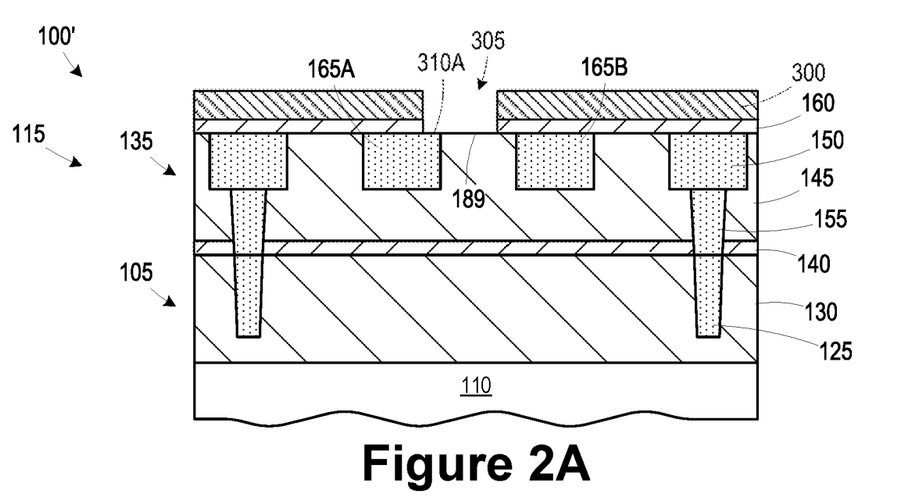
FIGS. 2A-2D are cross-sectional diagrams depicting illustrative techniques for forming a ballistic transport Schottky junction device.

FIGS. 2A-2E are cross-sectional diagrams depicting illustrative techniques for forming a ballistic transport Schottky junction device. FIG. 2A illustrates an alternative embodiment of a product 100' starting with the product 100 of FIG. 1A, after several processes were performed. A mask layer 300 (e.g., photoresist, patterned hard mask, or a photolithography stack of layers) was formed above the cap layer 160. The mask layer 300 was patterned to define an opening 305. The cap layer 160 was etched through the opening to expose an edge portion 310A of the conductive feature 165A and a portion 189 of the dielectric layer 145 positioned between the conductive features 165A, 165B, but covers the conductive feature 165B.

Figure 2B:
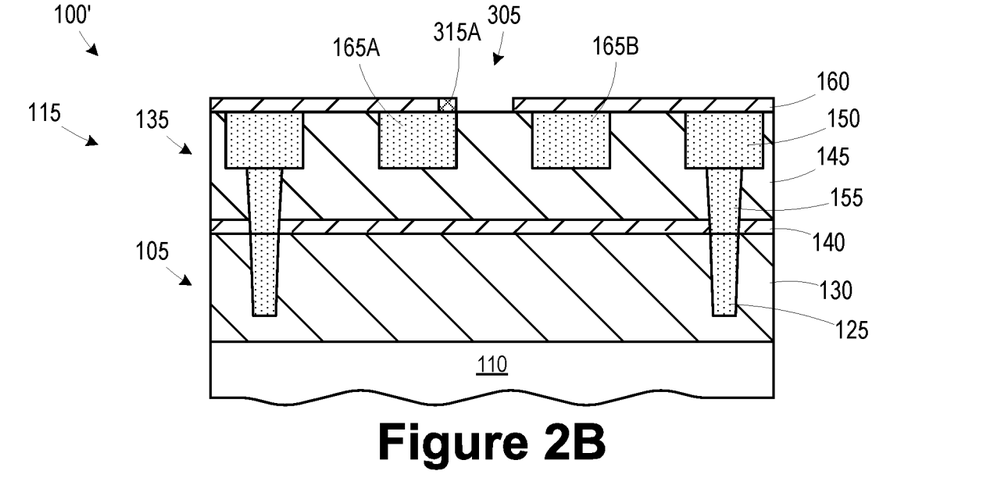

FIG. 2B illustrates the product 100' after a deposition process (e.g., electroless plating) was performed to form a barrier layer 315A over the exposed edge portion 310A (see FIG. 2A). The mask layer 300 may be removed prior to forming the barrier layer 315A.

Figure 2C:
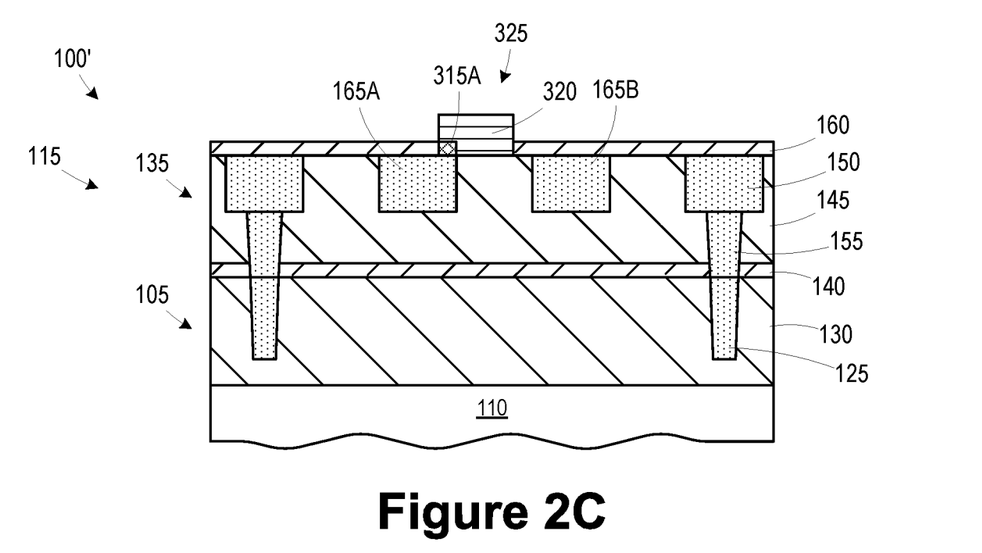

FIG. 2C illustrates the product 100' after a deposition process was performed to form a ballistic transport material layer 320 (e.g., similar to the ballistic transport layer 190) described above). A patterning process including multiple steps was performed to pattern the ballistic transport layer 320. The ballistic transport layer 320 and the conductive features 165A, 165B define a Schottky contact 325.

Figure 2D:
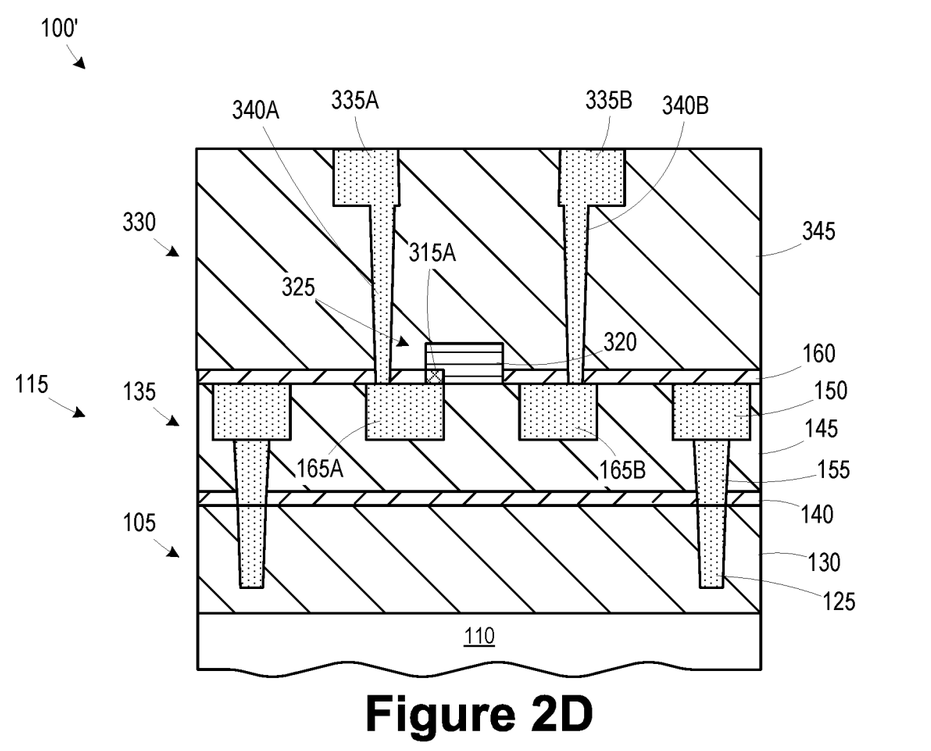

FIG. 2D illustrates the product 100' after a plurality of processes was performed to define a second metallization layer 330 of the metallization system 115 above the first metallization layer 135. The second metallization layer 330 may be formed using a conventional dual damascene process flow to define conductive lines 335A, 335B and vias 340A, 340B in a dielectric layer 345. The lines 335A, 335B and vias 340A, 340B contact the conductive features 165A, 165B, respectively. Although not illustrated, the back contacts using through-silicon vias illustrated in FIG. 1H may also be used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a first conductive feature and a second conductive feature positioned in a first dielectric layer positioned above a substrate;
   a cap layer positioned above the first dielectric layer;
   a ballistic transport material positioned above a portion of the first dielectric layer positioned between the first conductive feature and the second conductive feature; and
   a first contact contacting the first conductive feature and a second contact contacting the second conductive feature, wherein the first contact and the second contact extend from a back side of the substrate, wherein at least a portion of the first and second contacts are positioned in the first dielectric layer.

2. The device of claim 1, further comprising a second dielectric layer positioned above the cap layer and the ballistic transport material, wherein the first contact and the second contact are positioned in the second dielectric layer.

3. The device of claim 1, further comprising:
   a gate structure positioned above the ballistic transport material; and
   a third contact contacting the gate structure.

4. The device of claim 3, further comprising forming a second dielectric layer above the cap layer and the gate structure, wherein the third contact is positioned in the second dielectric layer.

5. The device of claim 3, further comprising a barrier layer positioned on portions of the first conductive feature and the second conductive feature, wherein the ballistic transport material contacts a first portion of the barrier layer positioned on the first conductive feature and a second portion of the barrier layer positioned on the second conductive feature.

6. The device of claim 3, wherein the gate structure comprises a conductive gate electrode and a gate insulation layer, wherein the gate insulation layer is positioned between the ballistic transport material and the conductive gate electrode, and wherein the ballistic transport material and the conductive gate electrode have approximately the same lateral width.

7. The device of claim 3, wherein the gate structure comprises a conductive gate electrode and a gate insulation layer, wherein the gate insulation layer is positioned between the ballistic transport material and the conductive gate electrode, and wherein a lateral width of the ballistic transport material is greater than a lateral width of the conductive gate electrode.

8. The device of claim 1, further comprising:
   a barrier layer positioned on a portion of the first conductive feature, wherein the ballistic transport material contacts the barrier layer.

9. A device, comprising:
   a first conductive feature and a second conductive feature positioned in a first dielectric layer;
   a cap layer positioned above the first dielectric layer;
   a barrier layer positioned on portions of the first conductive feature and the second conductive feature;
   a ballistic transport material contacting a first portion of the barrier layer positioned on the first conductive feature and a second portion of the barrier layer positioned on the second conductive feature and positioned above a portion of the first dielectric layer positioned between the first conductive feature and the second conductive feature; and
   a first contact contacting the first conductive feature and a second contact contacting the second conductive feature.

10. The device of claim 9, further comprising a second dielectric layer positioned above the cap layer and the ballistic transport material, wherein the first contact and the second contact are positioned in the second dielectric layer.

11. The device of claim 9, wherein the first dielectric layer is positioned above a substrate, and the first contact and the second contact extend from a back side of the substrate, wherein at least a portion of the first and second contacts are positioned in the first dielectric layer.

12. The device of claim 9, further comprising:
   a gate structure positioned above the ballistic transport material;
   a third contact contacting the gate structure; and
   a second dielectric layer above the cap layer and the gate structure, wherein the third contact is positioned in the second dielectric layer.

13. The device of claim 12, wherein the gate structure comprises a conductive gate electrode and a gate insulation layer, wherein the gate insulation layer is positioned between the ballistic transport material and the conductive gate electrode and wherein the ballistic transport material and the conductive gate electrode have approximately the same lateral width.

14. The device of claim 12, wherein the gate structure comprises a conductive gate electrode and a gate insulation layer, wherein the gate insulation layer is positioned between the ballistic transport material and the conductive gate electrode and wherein a lateral width of the ballistic transport material is greater than a lateral width of the conductive gate electrode.

15. A device, comprising:
- first and second conductive features positioned in a first dielectric layer;
- a cap layer positioned above the first dielectric layer;
- a barrier layer positioned on portions of the first and second conductive features;
- a ballistic transport material contacting the barrier layer on the first and second conductive features and positioned above a portion of the first dielectric layer positioned between the first conductive feature and the second conductive feature;
- a conductive gate electrode positioned above at least a portion of the ballistic transport material;
- a gate insulation layer positioned between the ballistic transport material and the conductive gate electrode;
- a first contact contacting the first conductive feature and a second contact contacting the second conductive feature; and
- a third contact contacting the gate structure.

16. The device of claim 15, further comprising a second dielectric layer positioned above the cap layer and the ballistic transport material, wherein the first contact, the second contact, and the third contact are positioned in the second dielectric layer.

17. The device of claim 15, wherein the first dielectric layer is positioned above a substrate, and the first contact and the second contact extend from a back side of the substrate, wherein at least a portion of the first contact and a portion of the second contact are positioned in the first dielectric layer.

18. The device of claim 15, wherein the ballistic transport material and the conductive gate electrode have approximately the same lateral width.

19. The device of claim 15, wherein a lateral width of the ballistic transport material is greater than a lateral width of the conductive gate electrode.

* * * * *